United States Patent [19]
White
[11] 3,897,282
[45] July 29, 1975

[54] METHOD OF FORMING SILICON GATE DEVICE STRUCTURES WITH TWO OR MORE GATE LEVELS

[75] Inventor: James Judson White, Kanata, Canada
[73] Assignee: Northern Electric Company Limited, Montreal, Canada

[22] Filed: Oct. 17, 1972
[21] Appl. No.: 298,364

[52] U.S. Cl. .................... 148/175; 29/571; 29/577; 29/578; 148/174; 148/188; 307/304; 357/24; 357/41; 357/59; 427/86; 427/88; 427/93
[51] Int. Cl.$^2$......... H01L 21/20; H01L 21/28; H01L 29/78; H01L 27/02
[58] Field of Search................. 307/304; 317/235 G; 148/174, 175, 188; 117/212, 213, 215; 29/571, 577, 578

[56] References Cited
UNITED STATES PATENTS

| | | | |
|---|---|---|---|
| 3,502,950 | 3/1970 | Nigh et al. | 317/235 G |
| 3,514,676 | 5/1970 | Fa | 317/235 |
| 3,519,901 | 7/1970 | Bean et al. | 148/174 X |
| 3,654,499 | 4/1972 | Smith | 317/235 R |
| 3,731,161 | 5/1973 | Yamamoto | 317/235 G |
| 3,760,202 | 9/1973 | Kosonocky | 317/235 G |

OTHER PUBLICATIONS

Altman, L., "New Concept for Memory and Imaging: Charge Coupling" Electronics, June 21, 1971, pp. 50–59.

Chiu, T. L., "Programmable Read–Only Memory Stack Gate Fet" IBM Tech. Discl. Bull., Vol. 14, No. 11, April, 1972, p. 3356.

*Primary Examiner*—L. Dewayne Rutledge
*Assistant Examiner*—W. G. Saba
*Attorney, Agent, or Firm*—Sidney T. Jelly

[57] ABSTRACT

Semiconductor device structures having multiple gate levels. The gate levels are composed of polycrystalline silicon. A single device may have two or more gate levels, separated by a dielectric, or different devices of a common structure may have differing threshold voltages by specific selection of particular polycrystalline silicon layers.

20 Claims, 14 Drawing Figures

PATENTED JUL 29 1975

SHEET 3

3,897,282

METHOD OF FORMING SILICON GATE DEVICE STRUCTURES WITH TWO OR MORE GATE LEVELS

This invention relates to silicon gate device structures, and is particularly concerned with methods of producing silicon-gate devices having two or more gate levels, and with such devices.

Standard silicon gate procedures use one layer of polycrystalline silicon to produce devices having a doped polycrystalline gate which is self-aligned with respect to doped regions of the substrate, with intervening dielectric layer or layers. Modified silicon gate procedures are used to prepare charge-transfer and similar devices having a single layer of doped polycrystalline silicon, dielectric layers and a metal layer. Also, a polycrystalline silicon layer on an oxidized silicon substrate has been used to prepare polycrystalline silicon, insulated-gate field-effect transistors -not self-aligned but electrically isolated from the substrate.

It has been proposed that multiple gate level devices would be extremely useful but hitherto such devices have not been produced efficiently. It is necessary, in these devices, to have a fully passivated dielectric so as to avoid a polarizable dielectric. It is also at least desirable that there be a low second level threshold. Further, the first level put down must be able to stand the high temperatures of subsequent processing.

The present invention provides device structures having two or more polycrystalline silicon levels or layers. Separation of the layers from each other and the substrate, is by a dielectric, such as silicon dioxide for example. Other dielectrics can be used. The present invention uses two or more polycrystalline layers to produce various types of devices, on the same chip if desired, one or more of which may use only one layer of polycrystalline silicon but with such devices having differing threshold voltages by using different polycrystalline silicon layers.

The invention will be understood by the following description of various devices and the related processes, by way of example, together with some of the possible variations therein, in conjunction with the accompanying drawings, in which.

Figure 1:
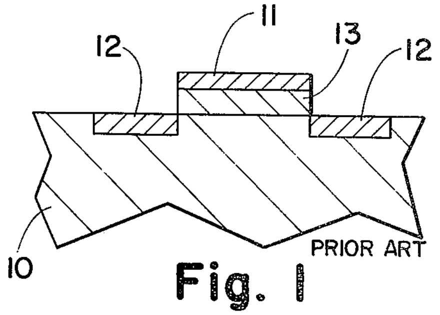
FIGS. 1, 2 and 3 are cross-sections through typical devices produced by conventional techniques.
Figure 2:
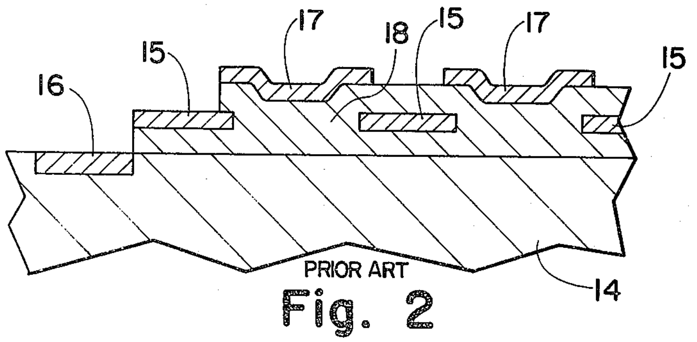
Figure 3:
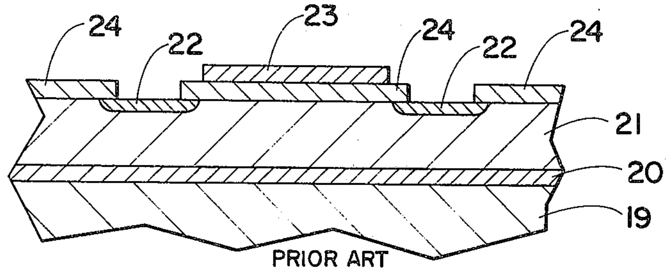

FIGS. 1, 2 and 3 illustrate some typical devices produced by conventional techniques, and which can be produced by the present invention with certain advantages, as will be described. In FIG. 1, a standard silicon gate MOS structure comprises a silicon substrate 10, a doped polycrystalline silicon layer 11, doped substrate areas 12 and a dielectric layer 13. FIG. 2 illustrates a charged coupled device (hereinafter referred to as a CCD) array comprising a silicon substrate 14, doped polycrystalline silicon areas 15, a doped substrate area 16, metal areas 17 and a dielectric 18. FIG. 3 illustrates a polycrystalline silicon field effect transistor (hereinafter referred to as an FET) comprising silicon substrate

19, a thermal oxide layer 20, an undoped polycrystalline silicon layer 21 having doped areas 22, a metal layer 23 and a dielectric 24.

Figures 4, 5, 6, 7:
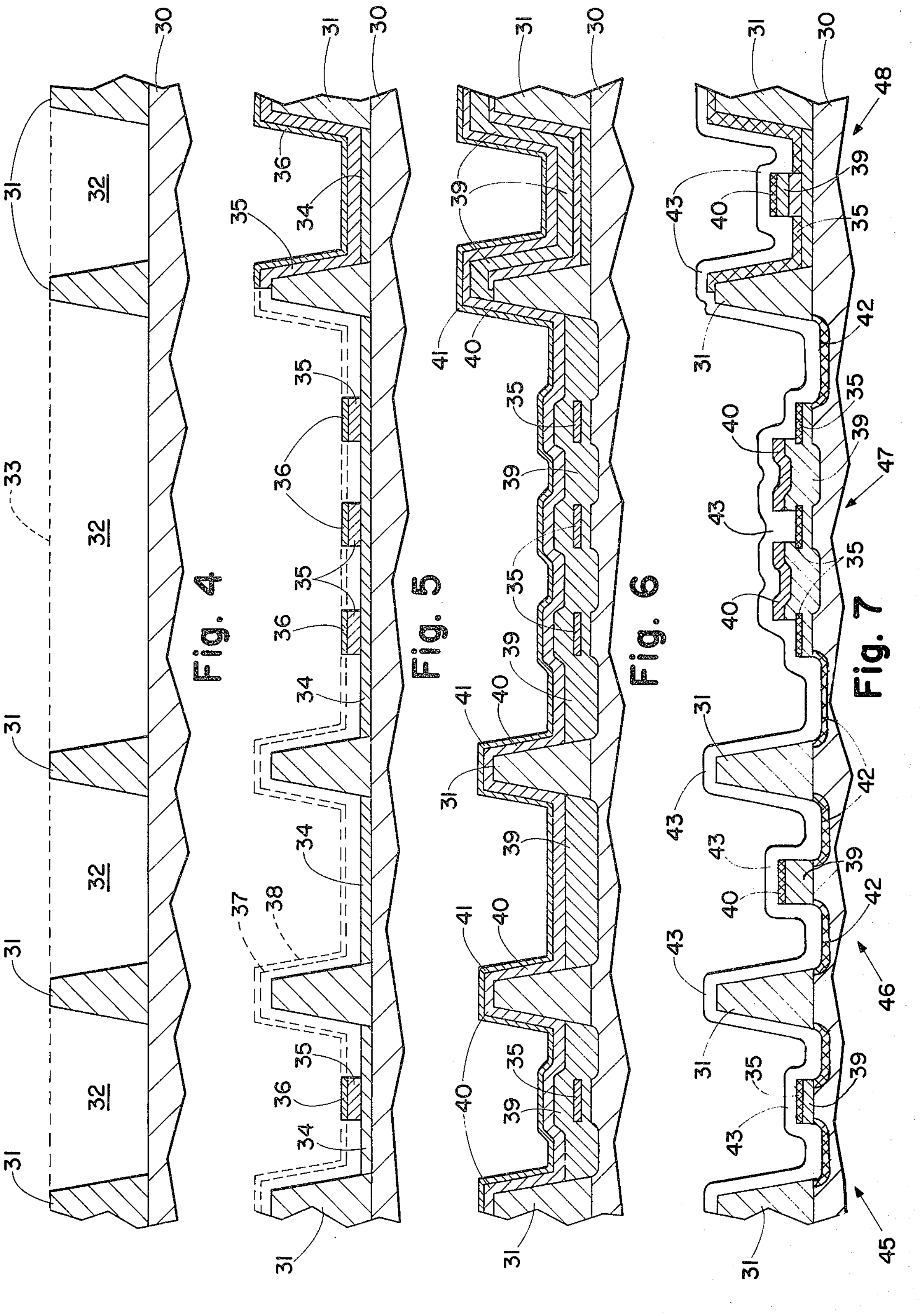
FIGS. 4 to 7 are cross-sections illustrating various stages in the production of devices, in accordance with the present invention.

Turning now to the present invention, FIGS. 4 to 7 illustrate various stages in the production of a plurality of devices on a common substrate. In the device of FIGS. 4 to 7, a single-crystal silicon substrate 30 has a layer of field oxide 31 grown thereon. The first photolithographic etch opens windows 32. FIG. 4 illustrates the arrangement at this stage, the original surface of the field oxide layer 31 indicated by the line 33.

As gate oxide layer 34 is then grown in the windows 32 and then a first layer of polycrystalline silicon 35 is deposited. A thin oxide layer 36 is then thermally grown on the layer 35. The oxide layer 36 is used in conjunction with a second photolithographic etch which removes unwanted portions of the first polycrystalline silicon layer 35. The structure is then as in FIG. 5, the original limits of the polycrystalline silicon layer 35 and oxide layer 36 indicated by the lines 37 and 38 respectively.

In the particular example illustrated, and being described, a thermal oxidation treatment is then used to oxidize part of the first polycrystalline silicon layer 35 and the underlying substrate 30 to produce oxide layer 39 in the gate regions. A second polycrystalline silicon layer 40 is then deposited followed by thermally growing a thin oxide layer 41. This stage is illustrated in FIG. 6.

Figure 6A:
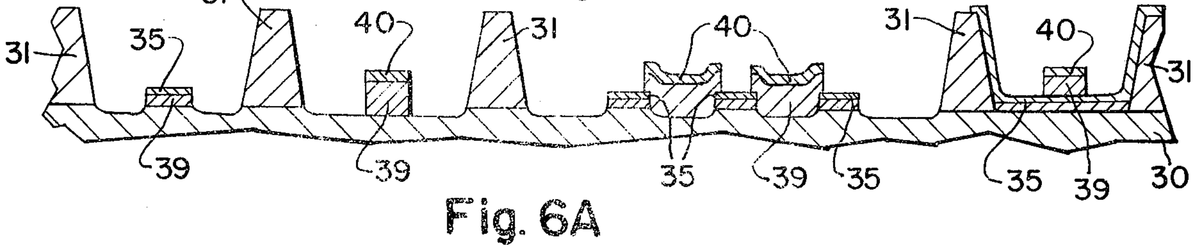

The oxide layer 41 is used in conjunction with a third photolithographic etching sequence which removes the oxide layer 41 and unwanted regions of the second polycrystalline silicon layer 40 and oxide layer 39, to provide the various forms of structures as seen in FIG. 6A. A deposition and diffusion cycle dopes the silicon substrate 30 to form sources and drains 42 and also dopes the two polycrystalline layers 35 and 40. A layer of phosphorous-doped silicon dioxide (or other suitable dielectric) 43 is then deposited for passivation. This is illustrated in FIG. 7. The various electrical contacts are than made, by conventional processes, to sources and drains 42, the polycrystalline layers 35 and 40, substrate 30 and other points as desired.

As will be appreciated from the above description the gates in the first polycrystalline silicon layer, and the interconnect plane for this layer, are formed during the second photolithographic etching sequence while the gates in the second polycrystalline silicon layer, the interconnect plane for this layer, and the sources and drains are defined during the third photolithographic etching sequence.

When fabricating p-channel device structures, for example on n-Si <111> 5–10 Ωcm silicon substrates, boron may be used for doping the source, drain and gates in first or second polycrystalline silicon layers, interconnects any other regions of exposed silicon. Fabrication of n-channel enhancement mode device structures, for example on p-Si <100> 1Ωcm silicon substrates, is similar except that phosphorous is a normal dopant.

The devices as finally fabricated in FIGS. 4 to 7 are: a normal silicon gate FET at 45 (FIG. 7), using the first polycrystalline silicon layer 35; a higher threshold silicon-gate FET at 46, using the second polycrystalline silicon layer 40; a double silicon-gate overlapping CCD array at 47, using both polycrystalline silicon layers 35 and 40; and a poly-silicon FET at 48, again using both polycrystalline silicon layers 35 and 40.

The poly-silicon FET 48, and other poly-silicon devices which can be fabricated, have acceptable self-alignment and can be electrically isolated completely from the silicon substrate, and/or from each other, by fabricating them on a dielectric layer. Further by keeping the polycrystalline silicon layer 35 thin, 0.2$\mu$ for example, and by diffusing sources and drains through to the underlying dielectric completely depleted channels can be formed. Reduced electrical interaction with the substrate can be achieved by fabricating the polycrystalline silicon devices on thicker gate oxides or on the field oxide 31.

Figure 8:
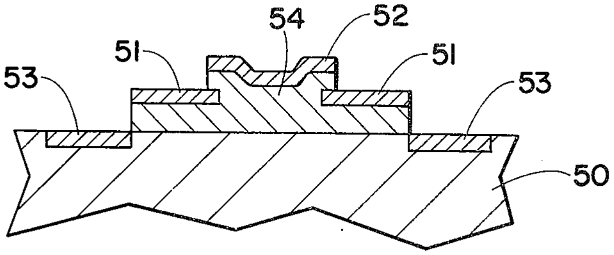
FIGS. 8, 9 and 10 are cross-sections through further forms of devices, made in accordance with the present invention.
Figure 9:
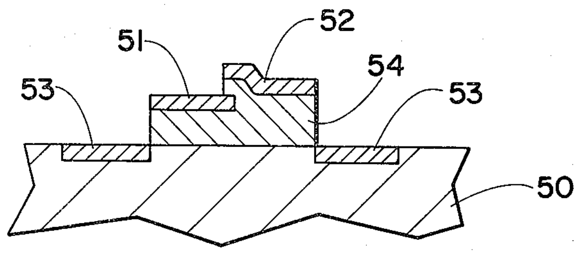
Figure 10:
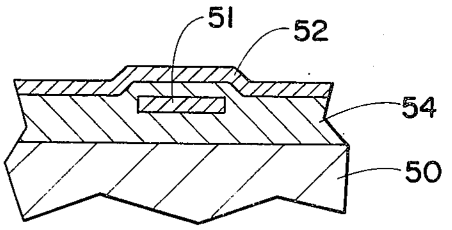

Various other forms of devices can also be formed. FIGS. 8, 9 and 10 illustrate three more examples, FIG. 8 being a surface-charge transistor, FIG. 9 a tetrode and FIG. 10 a polycrystalline silicon resistor plus shielding. In all these examples the substrate is at 50, a first polycrystalline silicon layer at 51, a second polycrystalline silicon layer at 52, sources and drains at 53 and the dielectric at 54.

It will be realized that while the invention has been described above, in conjunction with FIGS. 4 to 7, for the fabrication of various devices on a common substrate, the invention can be used to fabricate a single device on a substrate, and also to fabricate a number of similar devices on a common substrate. These similar devices can then after be separated by dividing the substrate, if desired.

Because the crystalline nature of deposited silicon layers is influenced by many factors -detailed deposition conditions and nature of the "substrate" for example- the structure of the deposited silicon layers may be amorphous, polycrystalline, monocrystalline or a mixture of these structures. For convenience the term "polycrystalline" has been used but should be interpreted accordingly.

Various modifications can be made to the process without departing from the broad concept of the invention, and such modifications may be useful for fabricating ease or with respect to the particular type of structure or structures to be made. Thus different or extra thermal treatments, etching and photolithographic etching processes can be used. The method of depositing the various layers can vary. The substrates may be plain single-crystal silicon wafers, with various impurity contents and of various crystallographic orientation. The substrates may be covered with an epitaxial layer and may have undergone prior diffusions and other treatments. The oxide or other dielectric layers, may be thermally grown, vapour-deposited, anodically formed, or evaporated for example. The polycrystalline silicon layers can be vapour deposited, evaporated or formed by other processes. One or more of the polycrystalline silicon layers can be doped during deposition, doped from overlying phosphorus-doped silicon dioxide and by other ways.

The number of layers of polycrystalline silicon can be increased by including the necessary extra steps to form dielectric layers, silicon layers, etching and so on. The use of different photoengraving procedures may obviate the need to form the post oxide layers 36 and 41 (FIGS. 5 and 6).

Other forms of devices can be formed on the same substrate. For example MNOS devices can be fabricated along with silicon-gate MOS, silicongate MNOS and other structures. Extra fabricating steps are usually permissible as the basic structural materials (oxide and silicon) can withstand considerable high-temperature processing if it occurs prior to the doping cycle. In the process of the present invention doping occurs after the basic structures are formed. A further example of extra processing is to include metal layers in the active regions of the device structure.

Direct electrical contacts can be made between the first polycrystalline silicon layer 35 and the substrate 30 by including an additional photolithography step prior to deposition of the layer 35. Such contacts can be incorporated into the present invention to produce novel device structures such as special polysilicon field-effect transistors and rectifying contacts.

Figure 11:
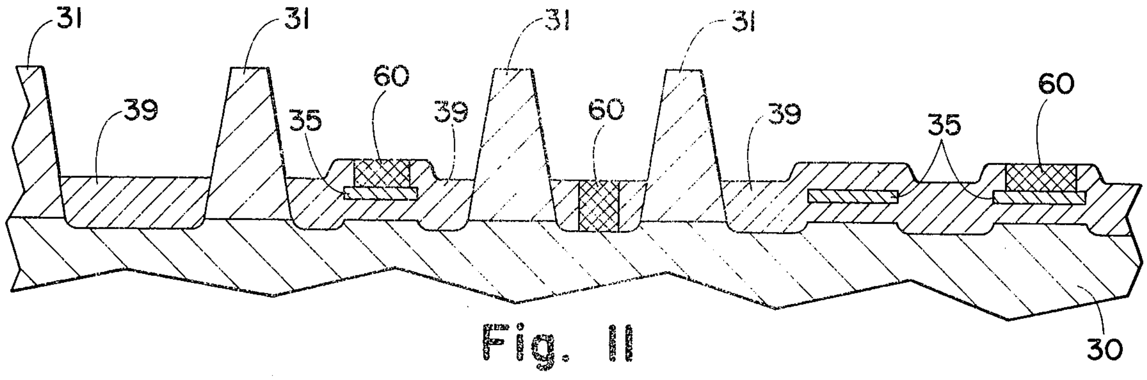
FIGS. 11, 12 and 13 are cross-sections of other forms of devices in accordance with the present invention.
Figure 12:
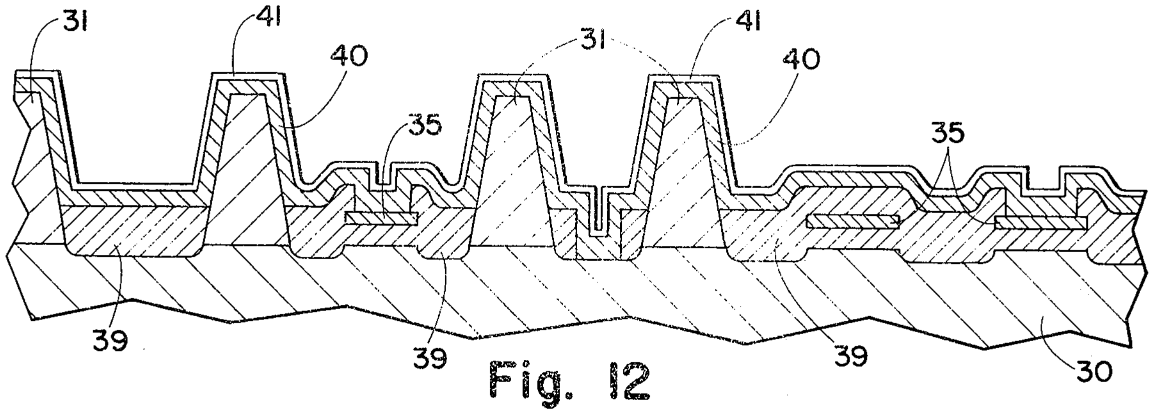
Figure 13:
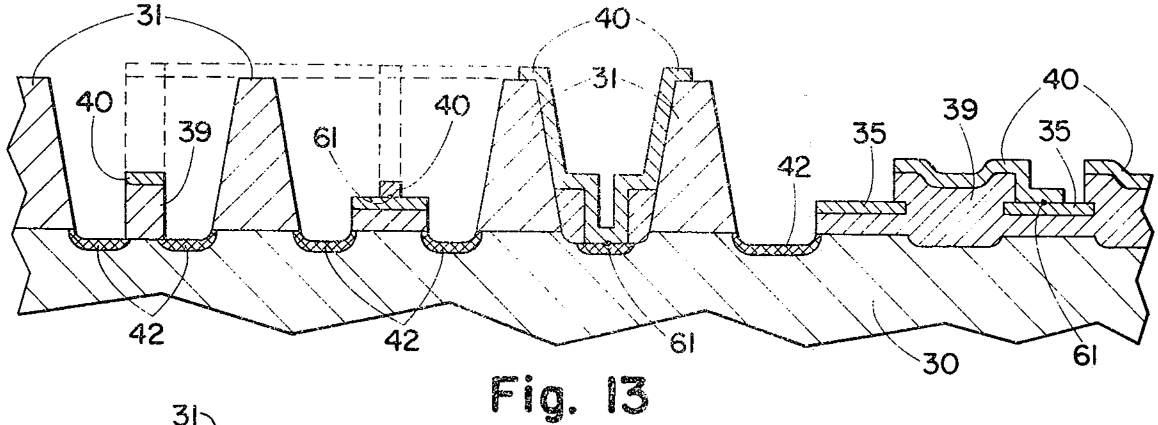

Direct electrical contacts can also be provided between the two polycrystalline silicon layers 35 and 40, or between layer 40 and the substrate 30, by inclusion of an additional photolithographic step prior to the deposition of the layer 40. FIGS. 11, 12 and 13 illustrate various stages in producing device structures having varying forms of electrical contact between polycrystalline layer 40 and either polycrystalline layer 35 or substrate 30. Where applicable, the same references are used in FIGS. 11 to 13 as in FIGS. 4 to 7 for the same details.

In FIG. 11 the structure is at a condition between that shown in FIG. 5 and that of FIG. 6. The field oxide 31 has been etched, a gate oxide layer formed, the first polycrystalline silicon layer 35 deposited and etched and then thermal oxidation carried out to form the oxide layer 39. Before deposition of the second polycrystalline silicon layer, an additional photo-etching step is used to remove unwanted portions of the oxide layer 39, as indicated at 60, wherever contacts with the first poly-silicon layer or substrate are wanted. The second layer of polycrystalline silicon 40 is then deposited and oxide layer 41 formed. This stage is illustrated in FIG. 12. The next photo-etch step, following the diffusion cycle produces the structure as in FIG. 13, the dopant diffusing through the poly-silicon layer 40 into the underlying layer 35 or the substrate 30, completing the desired electrical contacts 61.

Since the contacts 61 are doped, along with the sources and drains 42, gates and interconnects, after the second poly-silicon layer 40 is defined, this layer 40 is self-aligned with the doped contact regions. If the thickness of the poly-silicon layer is much less than the diffusion length for the dopant in either the poly-silicon or the substrate, the second poly-silicon layer 40 will always be doped and in contact with similarly doped first polysilicon layer 35 or substrate 30. Thus rectifying or erroneous contacts are avoided.

Direct gate interconnects, as in the right hand device of FIG. 13, reduce chip area by avoiding the need for separate contact pads and aluminum interconnects on the field oxide. This is of importance when fabricating densely-packed integrated circuits, folded CCD arrays and other items.

The present invention provides silicon gate devices, and methods of making such devices, which have unique structures. The devices can be made to have varying characteristics, for example normal or high threshold voltages by selecting the particular polycrystalline silicon layer which is utilized, as exampled by the FET structures 45 and 46 in FIG. 7. Two or more gate levels can be obtained by the deposition of the relevant member of polycrystalline silicon layers. Depending upon the particular device structure required, the arrangement of layers can be varied, and varying forms of interconnects made.

The processes for making the devices are commercially attractive in that a minimal number of steps are required, and avoiding complex or difficult operations.

High density of devices can be obtained and it is possible to provide multiple gate level devices, and other devices, previously proposed as of interest and value but hitherto not capable of manufacture, manufactured only with difficulty, or manufactured but not effective in operation. Many proposals have been made for two-level semiconductor devices -a typical example is very fast transistors i.e. tetrodes- but these have not previously been made, at least to a commercially effective extent.

Briefly, many of the advantages of the present invention can be summarized as follows:

i. It is very versatile. As described above, many different types of devices, including some novel types, can be cofabricated on the same chip.

ii. Device quality should be high -i.e. comparable with standard silicon-gate devices.

iii. It is flexible. Since the materials used in the device structures can withstand other high-temperature processing treatments, the basic process can be altered substantially. This flexibility is possible because doping (of sources, drains, gates, etc) usually occurs after all the basic device structures are formed.

iv. Since the basic process for two-level structures requires only one extra photolithographic etching step beyond standard silicon gate processing, it is competitive with other processes in providing similar structures.

v. Both levels of poly-silicon electrode are self-aligned with respect to adjacent diffused regions. This double self-alignment feature allows two-phase CCD arrays or other two-level overlapping arrays to begin or end with either an upper or a lower self-aligned electrode.

What is claimed is:

1. A method of producing a semiconductor device on a substrate, the device having at least two layers of polycrystalline silicon at different levels relative to the substrate, an edge of one layer at least substantially coincident with an edge of another layer, comprising:

a. forming a layer of field oxide on a surface of a single crystal substrate and defining a window of exposed substrate at a predetermined position for forming at least one device;

b. growing a layer of gate oxide on the exposed surface of said substrate in said window;

c. depositing a first layer of polycrystalline silicon on said layer of gate oxide and the exposed surface of said field oxide;

d. forming a layer to form a first masking layer on said first layer of polycrystalline silicon;

e. etching said first masking layer and said first polycrystalline silicon layer to form separated portions of said first polycrystalline silicon layer at predetermined positions;

f. thermally oxidizing the structure to form an oxide layer encompassing said portion of said first polycrystalline silicon layer, said oxide layer incorporating unmasked regions of said gate oxide layer and extending into said substrate at unmasked regions of said substrate;

g. depositing a second layer of polycrystalline silicon on said oxide layer formed in (*f*) and on the exposed surface of said field oxide;

h. forming a further layer to form a second masking layer, on said second layer of polycrystalline silicon;

i. etching sequentially said second masking layer and said second polycrystalline silicon layer and said oxide layer to form and uncover at least one portion of said second polycrystalline layer in a predetermined positioned relationship with said separated portions of said first polycrystalline silicon layer for formation of said device; to uncover at least a major part of said separate portion of said first layer of polycrystalline silicon; and to uncover said substrate at positions not masked by said field oxide layer and polycrystalline silicon layers;

j. doping unmasked portions of said polycrystalline silicon layers and simultaneously doping said substrate at said uncovered areas to form source and drain areas associated with said device as required;

k. forming a dielectric layer on each of said devices, and l. forming electrical contact areas.

2. A method as claimed in claim 1 for simultaneously producing at least one further semiconductor device on said substrate, said further device having at least one layer of polycrystalline silicon corresponding with one of said at least two layers of polycrystalline silicon, comprising:

in step (*a*) defining windows of exposed substrate in said layer of field oxide at predetermined positions for forming each of said devices;

in step (*e*) etching said first masking layer and said first polycrystalline layer to form said separated portions and to form any desired portions at any other device position; and in step (*i*) etching said second masking layer and said second polycrystalline layer to form said at least one portion of said second polycrystalline silicon layer and to form any desired portions at any other device position.

3. A method as claimed in claim 1, said first masking layer an oxide layer, including photolithographically etching said oxide masking layer, removing photoresist layer, etching the first layer of polycrystalline silicon, and etching said oxide masking layer.

4. A method as claimed in claim 1 including, after step (*f*):

photolithographically etching said oxide layer formed by said thermal oxidation, at positions to define access regions to at least one of said first layer of polycrystalline silicon and said substrate; whereby said second layer of polycrystalline silicon will contact at least one of said first layer and said substrate.

5. A method as claimed in claim 1 including positioning said one portion of said second polycrystalline silicon layer relative to said separated portions of said first polycrystalline silicon layer to form a device of the charge coupled type.

6. A method of producing a multiplicity of silicon gate devices on a substrate, said devices comprising at least one device at one region and having two layers of polycrystalline silicon at different levels relative to said substrate and at least one device at a further region and having a layer of polycrystalline silicon at a level corresponding to one of said two layers of polycrystalline silicon, comprising:

a. forming a layer of field oxide on a surface of a single crystal substrate and defining windows of exposed substrate in said layer of said oxide at positions for forming devices at said regions;

b. growing a layer of gate oxide on the exposed surface of said substrate in said windows;

c. depositing a first layer of polycrystalline silicon on said layer of gate oxide and the exposed surface of said field oxide;

d. forming a layer to form a first masking layer on said first layer of polycrystalline silicon;

e. etching said first masking layer and said first polycrystalline silicon layer to form separated portions of said first polycrystalline silicon layer for said device at said one region, and for forming anny desired portions of said first polycrystalline silicon layer for said device at said further region;

f. thermally oxidizing the structure to form an oxide layer encompassing said portions of said first polycrystalline silicon layer, said oxide layer incorporating unmasked regions of said gate oxide layer and extending into said substrate at unmasked regions of said substrate;

g. depositing a second layer of polycrystalline silicon on said oxide layer formed in (*f*) and on the exposed surface of said field oxide;

h. forming a further layer to form a second masking layer, on said second layer of polycrystalline silicon;

i. etching sequentially said second masking layer, said second polycrystalline silicon layer and said oxide layer to form and uncover at least one portion of said second polycrystalline silicon layer in a predetermined relationship with said separated portions of said first polycrystalline silicon layer for formation of said device at said one region and to form any desired portion of said second polycrystalline silicon layer for formation of said device at said further region, to uncover at least a major part of said separate portion of said first layer of polycrystalline silicon; and to form defined uncovered areas of substrate;

j. doping unmasked portions of said polycrystalline silicon layers and simultaneously doping said substrate at said uncovered areas to form source and drain areas associated with a device as required;

k. forming a dielectric layer on each of said devices; and l. forming electrical contact areas.

7. A method as claimed in claim 6, said first masking layer an oxide layer, including photolithographically etching said oxide masking layer, removing photoresist layer, etching the first layer of polycrystalline silicon, and etching said oxide masking layer.

8. A method as claimed in claim 6, including, after step (*f*):

photolithographically etching said oxide layer formed by said thermal oxidation, at positions to define access regions to at least one of said first layer of polycrystalline silicon and said substrate; whereby said second layer of polycrystalline silicon will contact at least one of said first layer and said substrate.

9. A method as claimed in claim 6, including positioning said one portion of said second polycrystalline silicon layer relative to said separated portions of said first polycrystalline silicon layer to form a device of the charge coupled type.

10. A method as claimed in claim 9, including in step (*e*), forming a portion of said first polycrystalline silicon layer at said further region to form a normal threshold silicon gate field effect transistor.

11. A method as claimed in claim 9, including in (*i*), forming a portion of said second polycrystalline silicon layer at said further region to form a high threshold silicon gate field effect transistor.

12. A method as claimed in claim 9, including forming a portion of said first polycrystalline silicon layer and a portion of said second polycrystalline silicon layer at said further region and relatively positioned to form a field effect transistor.

13. A method as claimed in claim 9, including forming separated portions of said first polycrystalline silicon layer at said further region and forming a portion of said second polycrystalline layer at a positive relative to said separated portions at said further region, to form a surface charge transistor.

14. A method as claimed in claim 9, including forming a portion of said first polycrystalline silicon layer and a portion of said second polycrystalline silicon at said further region, said portions relatively positioned to form a tetrode.

15. A method as claimed in claim 9, including forming a portion of said first polycrystalline silicon layer at said further region and forming a portion of said second polycrystalline silicon layer overlying said portion of said first layer, to form a polycrystalline silicon resistor plus shielding.

16. A method of producing a multiplicity of silicon gate semiconductor devices on a substrate, said devices comprising a device of the charge coupled type having at least two layers of polycrystalline silicon at different levels relative to the substrate, and at least one other form of silicon gate device having a layer of polycrystalline silicon at a level corresponding with the lower of said levels of said charge coupled type, comprising:

a. forming a layer of field oxide on a surface of a substrate and defining windows of exposed substrate at spaced regions, one region for said charged coupled type and a further region for each other device;

b. growing a layer of gate oxide on the exposed surface of said substrate at said regions;

c. depositing a first layer of polycrystalline silicon on said layer of gate oxide and the exposed surface of said field oxide;

d. forming a layer to form a first masking layer on said first layer of polycrystalline silicon;

e. etching said first masking layer and said first polycrystalline silicon layer to form separated portions of said first polycrystalline silicon layer at predetermined positions at said one region, and a portion of said first polycrystalline silicon layer at a further region;

f. thermally oxidizing the structure to form an oxide layer encompassing said portions of said first polycrystalline silicon layer, said oxide layer incorporating unmasked regions of said gate oxide layer and extending into said substrate at unmasked regions of said substrate;

g. depositing a second layer of polycrystalline silicon on said oxide layer formed in (*f*) and on the exposed surface of said field oxide;

h. forming a further layer to form a second masking layer, on said second layer of polycrystalline silicon;

i. etching sequentially said second masking layer, said second polycrystalline silicon layer and said oxide layer to form at least one portion of said second polycrystalline layer at said one region, said one portion positioned over a gap between said separated portions of said first polycrystalline silicon layer, the edges of said one portion at least coincident with the edges of said separated portions for formation of said device of charge coupled type; to uncover said portions of the polycrystalline silicon layers and to uncover said substrate at positions not masked by said field oxide and said portions of the polycrystalline silicon layers, j. doping unmasked portions of said polycrystalline silicon layers and simultaneously doping said substrate at said uncovered areas to form source and drain areas associated with said devices as required;

k. forming a dielectric layer on each of said devices, and l. forming electrical contact areas.

17. A method of producing a multiplicity of silicon gate semiconductor devices on a substrate, said devices comprising a device of the charge coupled type having at least two layers of polycrystalline silicon at different levels relative to the substrate, and at least one other form of silicon gate device having a layer of polycrystalline silicon at a level corresponding with one of said levels above the lower level of said charge coupled type, comprising:

a. forming a layer of field oxide on a surface of a substrate and defining windows of exposed substrate at spaced regions, one region for said charge coupled type and a further region for each other device;

b. growing a layer of gate oxide on the exposed surface of said substrate at said regions;

c. depositing a first layer of polycrystalline silicon on said layer of gate oxide and the exposed surface of said field oxide;

d. forming a layer to form a first masking layer on said first layer of polycrystalline silicon;

e. etching said first masking layer and said first polycrystalline silicon layer to form separated portions of said first polycrystalline silicon layer at predetermined positions at said one region;

f. thermally oxidizing the structure to form an oxide layer encompassing said portion of said first polycrystalline silicon layer, said oxide layer incorporating unmasked regions of said gate oxide layer and extending into said substrate at unmasked regions of said substrate;

g. depositing a second layer of polycrystalline silicon on said oxide layer formed in (*f*) and on the exposed surface of said field oxide;

h. forming a further layer to form a second masking layer, on said second layer of polycrystalline silicon;

i. etching said second masking layer, said second polycrystalline silicon layer and said oxide layer to form at least one portion of said second polycrystalline layer at said one region, said one portion positioned over a gap between said separated portions of said first polycrystalline silicon layer the edges of said one portion at least coincident with the edges of said separated portion for formation of said device of charge coupled type; to form a portion of said second polycrystalline silicon layer at a further region; to uncover said portions of the polycrystalline layers; and to uncover said substrate at positions not masked by said field oxide and said portions of the polycrystalline silicon layers;

j. doping unmasked portions of said polycrystalline silicon layers and simultaneously doping said substrate at said uncovered areas to form source and drain areas associated with said device as required;

k. forming a dielectric layer on each of said devices, and l. forming electrical contact areas.

18. A method of producing a multiplicity of silicon gate semiconductor devices on a substrate, said devices comprising a device of the charge coupled type having at least two layers of polycrystalline silicon at different levels relative to the substrate, and at least one other form of silicon gate device having a layer of polycrystalline silicon at a level corresponding with the lower of said levels of said charge coupled type comprising:

a. forming a layer of field oxide on a surface of a substrate and defining windows of exposed substrate at spaced regions, one region for said charged coupled type and a further region for each other device;

b. growing a layer of gate oxide on the exposed surface of said substrate at said regions;

c. depositing a first layer of polycrystalline silicon on said layer of gate oxide and the exposed surface of said field oxide;

d. forming a layer to form a first masking layer on said first layer of polycrystalline silicon;

e. etching said first masking layer and said first polycrystalline silicon layer to form separated portions of said first polycrystalline silicon layer at predetermined positions at said one region, and a portion of said first polycrystalline silicon layer at a further region;

f. thermally oxidizing the structure to form an oxide layer encompassing said portions of said first polycrystalline silicon layer, said oxide layer incorporating unmasked regions of said gate oxide layer and extending into said substrate at unmasked regions of said substrate;

g. depositing a second layer of polycrystalline silicon on said oxide layer formed in (*f*) and on the exposed surface of said field oxide;

h. forming a further layer to form a masking layer, on said second layer of polycrystalline silicon;

i. etching said second masking layer, said second polycrystalline layer and said oxide layer to form at least one portion of said second polycrystalline layer at said one region, said one portion positioned over a gap between said separated portions of said first polycrystalline silicon layer, the edges of said one portion at least coincident with the edges of said separated portions, for formation of said device of charge coupled type; to form a portion of said second polycrystalline silicon layer at a further region, said portion of the second polycrystalline silicon layer at said further region overlapping said portion of said first polycrystalline silicon layer at said further region; to uncover said portions of the polycrystalline silicon layers; and to uncover said substrate at positions not masked by said field oxide and said portions of the polycrystalline silicon layers;

j. doping unmasked portions of said polycrystalline silicon layers and simultaneously doping said substrate at said uncovered areas to form source and drain areas associated with said device as required;

k. forming a dielectric layer on each of said devices, and l. forming electrical contact areas.

19. A method of producing a multiplicity of silicon gate semiconductor devices on a substrate, said devices comprising a device of the charge coupled type having at least two layers of polycrystalline silicon at different levels relative to the substrate, and at least one other form of silicon gate device having a layer of polycrystalline silicon at a level corresponding with the lower of said levels of said charge coupled type, comprising:

a. forming a layer of field oxide on a surface of a substrate and defining windows of exposed substrate at spaced regions, one region for said charged coupled type and a further region for each other device;

b. growing a layer of gate oxide on the exposed surface of said substrate at said regions;

c. depositing a first layer of polycrystalline silicon on said layer of gate oxide and the exposed surface of said field oxide;

d. forming a layer to form a first masking layer on said first layer of polycrystalline silicon;

e. etching said first masking layer and said first polycrystalline silicon layer to form separated portions of said first polycrystalline silicon layer at predetermined positions at said one region, and a portion of said first polycrystalline silicon layer at a further region;

f. thermally oxidizing the structure to form an oxide layer encompassing said portions of said first polycrystalline silicon layer, said oxide layer incorporating unmasked regions of said gate oxide layer and extending into said substrate at unmasked regions of said substrate;

g. depositing a second layer of polycrystalline silicon on said oxide layer formed in (*f*) and on the exposed surface of said field oxide;

h. forming a further layer to form a masking layer, on said second layer of polycrystalline silicon;

i. etching said second masking layer, said second polycrystalline layer and said oxide layer to form at least one portion of said second polycrystalline layer at said one region, said one portion positioned over a gap between said separated portions of said first polycrystalline silicon layer, the edges of said one portion at least coincident with the edges of said separated portions, for formation of said device of charge coupled type; to form a portion of said second polycrystalline silicon layer at a further region, said portion of the second polycrystalline silicon layer at said further region overlying said portion of said first polycrystalline silicon layer at said further region; to uncover said portions of the polycrystalline silicon layers; and to uncover said substrate at positions not masked by said field oxide and said portions of the polycrystalline silicon layers;

j. doping unmasked portions of said polycrystalline silicon layers and simultaneously doping said substrate at said uncovered areas to form source and drain areas associated with said device as required;

k. forming a dielectric layer on each of said devices, and l. forming electrical contact areas.

20. A method of producing a multiplicity of silicon gate semiconductor devices on a substrate, said devices comprising a device of the charge couple type having at least two layers of polycrystalline silicon at different levels relative to the substrate, and at least one other form of silicon gate device having a layer of polycrystalline silicon at a level corresponding with the lower of said levels of said charge coupled type, comprising:

a. forming a layer of field oxide on a surface of a substrate and defining windows of exposed substrate at spaced regions, one region for said charged coupled type and a further region for each other device;

b. growing a layer of gate oxide on the exposed surface of said substrate at said regions;

c. depositing a first layer of polycrystalline silicon on said layer of gate oxide and the exposed surface of said field oxide;

d. forming a layer to form a first masking layer on said first layer of polycrystalline silicon;

e. etching said first masking layer and said first polycrystalline silicon layer to form separated portions of said first polycrystalline silicon layer at predetermined positions at said one region, and spaced portions of said first polycrystalline silicon layer at a further region;

f. thermally oxidizing the structure to form an oxide layer encompassing said portions of said first polycrystalline silicon layer, said oxide layer incorporating unmasked regions of said gate oxide layer and extending into said substrate at unmasked regions of said substrate;

g. depositing a second layer of polycrystalline silicon on said oxide layer formed in (*f*) and on the exposed surface of said field oxide;

h. forming a further layer to form a masking layer, on said second layer of polycrystalline silicon;

i. etching said second masking layer, said second polycrystalline layer and said oxide layer to form at least one portion of said second polycrystalline layer at said one region, said one portion positioned over a gap between said separated portions of said first polycrystalline silicon layer, the edges of said one portion at least coincident with the edges of said separated portions, for formation of said device of charge coupled type; to form a portion of said second polycrystalline silicon layer at said further region positioned over a gap between said separated portions of said first polycrystalline silicon layer at said further region, the edges of said portion of said second polycrystalline silicon layer at least coincident with the edges of said spaced portions of said first polycrystalline silicon layer at said further region; to uncover said portions of the polycrystalline silicon layers; and to uncover said substrate at positions not masked by said field oxide and said portions of the polycrystalline silicon layers;

j. doping unmasked portions of said polycrystalline silicon layers and simultaneously doping said substrate at said uncovered areas to form source and drain areas associated with said device as required;

k. forming a dielectric layer on each of said devices, and l. forming electrical contact areas.

* * * * *